(12) United States Patent
Jewett

(10) Patent No.: US 7,532,049 B2
(45) Date of Patent: May 12, 2009

(54) REDUCED-NOISE FREQUENCY DIVIDER SYSTEM

(75) Inventor: Robert E. Jewett, Redwood City, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 263 days.

(21) Appl. No.: 11/588,502

(22) Filed: Oct. 27, 2006

(65) Prior Publication Data

US 2008/0186063 A1 Aug. 7, 2008

(51) Int. Cl.
*H03B 19/00* (2006.01)
(52) U.S. Cl. .................. 327/117; 327/115; 327/361
(58) Field of Classification Search .......... 327/115, 327/117, 118, 551, 360, 361; 377/47, 48
See application file for complete search history.

(56) References Cited

U.S. PATENT DOCUMENTS 6,087,865 A * 7/2000 Bradley ............... 327/117
6,784,751 B2 * 8/2004 Salmi et al. ............ 331/16

* cited by examiner

*Primary Examiner*—Long Nguyen

(57) ABSTRACT

Embodiments of a reduced noise reduction system ("RN-FDS") include a frequency divider and a resampler in signal communication with the frequency divider. The frequency divider receives an input signal and, in response, produces a divided signal. The input signal has a first frequency and the divided signal has a second frequency, different from the first frequency. The resampler receives the input signal and the divided signal, and resamples the divided signal using the input signal as a sampling clock signal to produce a resampled output signal. The frequency divider imposes edge jitter on the divided signal. Resampling the divided signal produces the resampled output signal with an edge jitter comparable with that of the input signal.

17 Claims, 11 Drawing Sheets

US 7,532,049 B2

REDUCED-NOISE FREQUENCY DIVIDER SYSTEM

BACKGROUND

Frequency dividers are commonly used to produce lower-frequency signals from higher-frequency signals. Frequency dividers are important building blocks of electronic circuits. In some electronic circuits, a frequency divider constitutes part of a phase-locked loop ("PLL") or another frequency-generating electronic circuit. Generally, a PLL is a circuit that permits an external reference signal to control the frequency and phase of a signal generated by a frequency source that is part of the PLL.

Some PLL circuits include a voltage-controlled oscillator ("VCO"), a phase detector, and a filter. In such PLL circuits, the frequency of the VCO is the same as the frequency of the external reference signal. Other PLL circuits additionally include a frequency divider. In such PLL circuits, the frequency of the VCO is a multiple of the external reference signal. As an example, a frequency synthesizer having a PLL that includes a frequency divider and in which the external reference signal is provided by a crystal oscillator, will derive output signals at different frequencies from the signal generated by the VCO. The signal generated by the VCO is referenced to the external reference signal. The frequency synthesizer output signals will have the same frequency stability as the external reference signal provided by the crystal oscillator.

Unfortunately, while frequency dividers are advantageous for producing signals with different frequencies, the signals they produce tend to have a higher noise level than the original signal because frequency dividers impose significant jitter on the transitions of the signals they produce. Such signals therefore exhibit high levels of phase noise. Therefore, there is a need for a reduced noise frequency divider system and reduced-noise frequency divider method.

BRIEF DESCRIPTION OF THE DRAWINGS

The components in the figures are for illustrating the principles of the invention. In the figures, like reference numerals designate corresponding parts throughout the different views.

DETAILED DESCRIPTION

In general, embodiments of the invention provide a reduced-noise frequency divider system ("RNFDS") in which a frequency divider divides an input signal in frequency, and noise produced by the frequency divider is reduced by resampling the divided signal generated by the frequency divider using the input signal of the frequency divider as a sampling clock signal. In one embodiment, the RNFDS includes a frequency divider and a resampler in signal communication with the frequency divider. The frequency divider is connected to receive an input signal and, in response, produces a divided signal. The input signal has a first frequency and the divided signal has a second frequency that is a fraction of the frequency of the input signal. Additionally, the resampler is connected to receive the input signal and the divided signal and, in response, produces a resampled output signal. The phase noise of the resampled output signal is lower than that of the divided signal output by the frequency divider.

Figure 1:
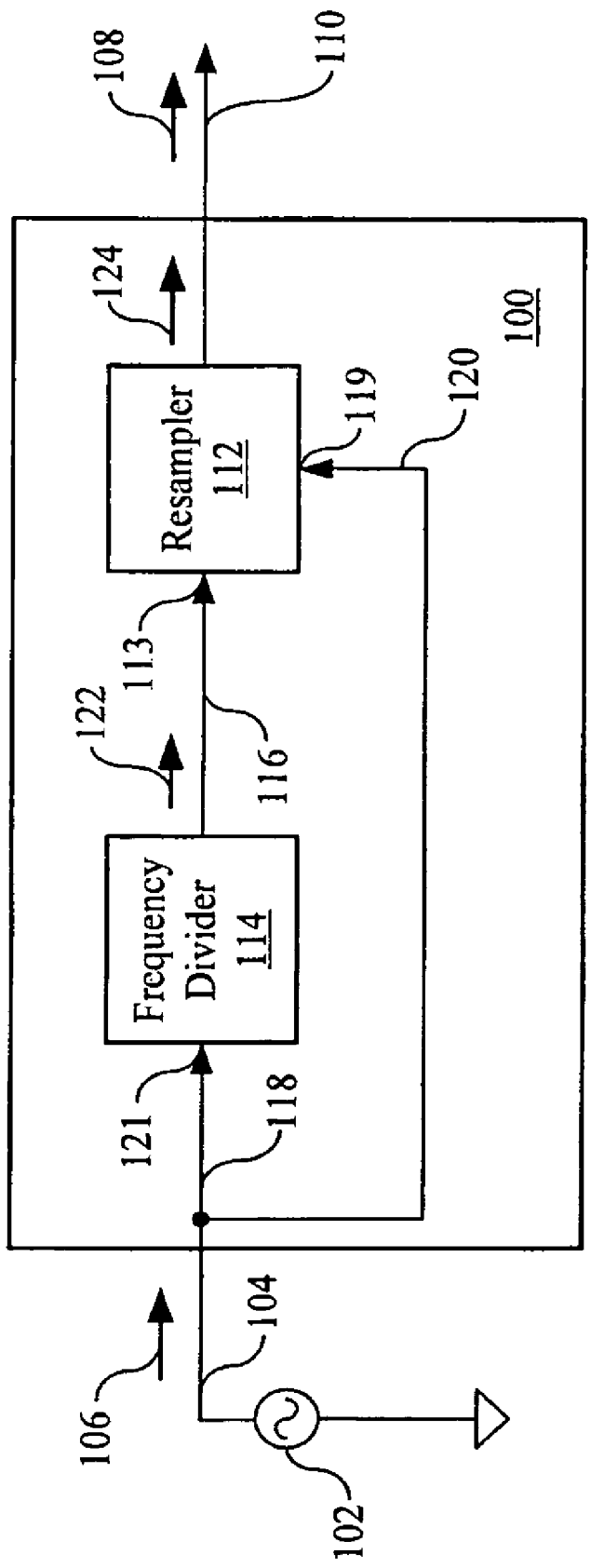
FIG. 1 is a block diagram showing an example of a reduced-noise frequency divider system ("RNFDS") in accordance with an embodiment of the present invention.

FIG. 1 is a block diagram showing an example of an RNFDS 100 in accordance with an embodiment of the invention. In the example shown, the RNFDS 100 is connected to an external frequency source 102 via a signal path 104. In an example of operation, the RNFDS 100 receives an input signal 106 from the external frequency source 102 via a signal path 104 and, in response, produces a reduced-noise output signal 108 that is output via a signal path 110.

The RNFDS 100 includes a resampler 112 and a frequency divider 114. The resampler 112 has a signal input 113 and a clock input 119. The signal input 113 is connected to the output of the frequency divider 114 via a signal path 116. The external frequency source 102 is connected to the frequency divider 114 via a signal path 118 and to the clock input 119 of resampler 112 via a signal path 120.

The frequency divider 114 is a device that produces a divided signal having a lower frequency from an input signal having a higher frequency. Thus, the divided signal is divided in the sense that it is divided in frequency relative to the input signal. In an example in which the frequency divider 114 is an integer digital divider (i.e., a divide-by-N type frequency divider where N is an integer representing the modulus, also known as the "division factor," of the frequency divider), the divided signal 122 will have a frequency that is lower than the frequency of the input signal 106. In this example, the frequency of the divided signal 122 is equal to the frequency of the input signal divided by the modulus N.

The resampler 112 is a device capable of resampling the divided signal 122 and producing a resampled output signal 124. In general, resampling is a process by which an input signal with either or both phase noise and amplitude noise is converted to an output signal having either or both of precisely and consistently defined transition timings and a precisely defined amplitude. The output signal has the same non-noise information content as the input signal. In some embodiments, the resampler 112 is a differential device. Circuits suitable for use as the resampler 112 are known in the art. An example of a dual resampler, part of which can be used as the resampler 112, will be described below with reference to FIG. 9.

The input signal 106 provided by the external frequency source 102 is additionally input to the resampler 112 where it serves as the resampling clock signal to resample the divided signal 122. Thus, the external frequency source 102 acts as a sampling clock source for the resampler 112 and therefore may be regarded as a "sampling clock source." Moreover, the input signal 106 provided to clock signal input 119 may be regarded as a "sampling clock signal."

The phase noise of the resampled output signal 124 depends mainly on the phase noise of the input signal 106 provided by the external frequency source 102 as the sampling clock signal for the resampler 112. Thus, for the resampled output signal 124 to have a low level of phase noise, the external frequency source 102 should be a low-noise frequency source. Examples of oscillators suitable for use as the external frequency source include low-noise types of a crystal oscillator ("XO"), a voltage-controlled oscillator ("VCO"), a voltage-controlled crystal oscillator ("VCXO"), or another type of oscillator.

Optionally, the external frequency source 102 has differential output that provides the input signal 106 as a differential signal having an in-phase component and an antiphase component. If the external frequency source 102 provides a single-ended input signal having only an in-phase component, and the resampler 112 requires a differential clock signal, the RNFDS 100 may additionally include an inverter. As will be described in more detail below with reference to FIG. 8, the input of the inverter is connected to the external frequency source 102 to receive the input signal 106. The inverter inverts the input signal 106 to produce an antiphase component of the input signal. The antiphase component of the input signal is input to the clock input 119 of the resampler 112 together with the in-phase component of the input signal 106 provided by the external frequency source 102 as a differential sampling clock signal.

In an example of operation, the RNFDS 100 receives the input signal 106 and inputs the input signal 106 to the clock input 119 of the resampler 112 and to the frequency divider 114. The frequency divider 114 receives the input signal 106 and, in response, produces the divided signal 122. The divided signal 122 has a higher level of phase noise than the input signal 106 because of edge jitter imposed on its transitions by the frequency divider 114. The frequency of the divided signal 122 is equal to the frequency of the input signal 106 divided by the modulus N of the frequency divider 114. The divided signal 122 passes directly to the signal input 113 of resampler 112.

In response to the input signal 106 received at its clock input 119, the resampler 112 samples the divided output signal 122 to provide a resampled output signal 124. The resampler 112 samples the divided signal 122 at portions of the divided signal 122 at which the divided signal 122 is stable, i.e., the resampler 112 resamples the divided signal 122 at the non-transitionary portions of the divided signal 122. The RNFDS 100 outputs a reduced-noise output signal 108 that, in this example, is the same as the resampled output signal 124.

Figure 2:
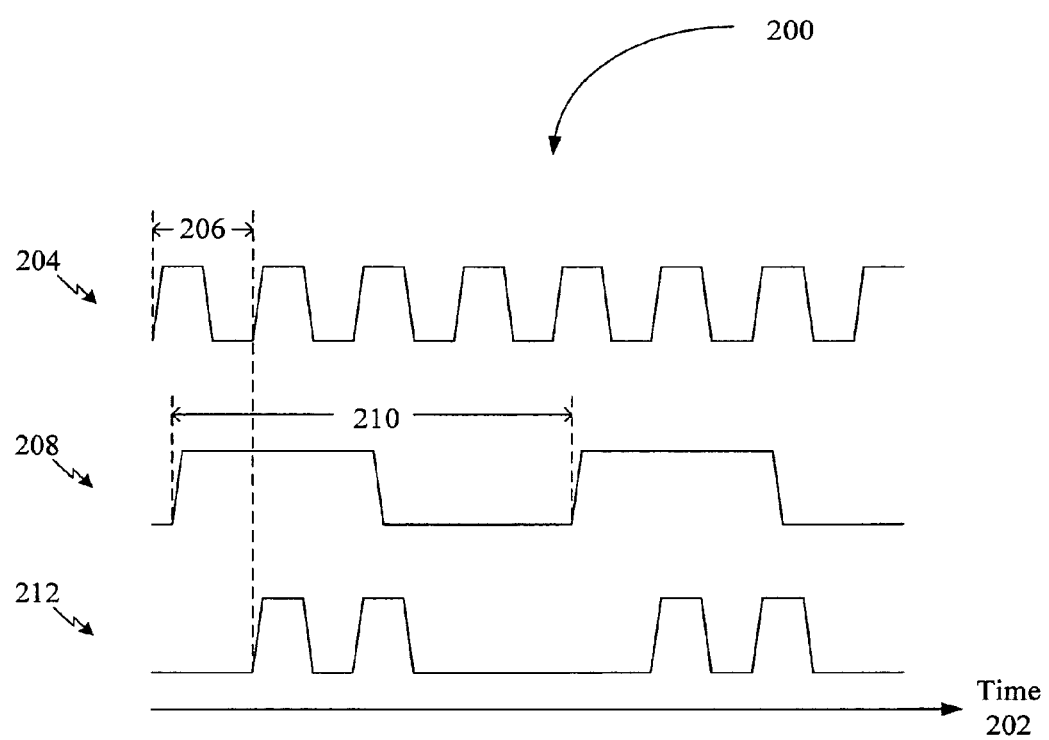
FIG. 2 is a timing diagram showing exemplary waveforms of signals in the RNFDS shown in FIG. 1.

FIG. 2 is a timing diagram 200 showing exemplary waveforms of signals in an example of the RNFDS 100 in which the frequency divider 114 is a divide-by-four frequency divider. The waveforms shown are voltages or currents plotted against time 202. In this example, the waveform of input signal 106 is shown at 204 as a series of pulses, with each pulse having a first period 206. The waveform of the divided signal 122 produced by the divide-by-four frequency divider 114 is shown at 208 as a series of pulses. Each pulse has a second period 210. In this example, the second period 210 is four times as long as the first period 206. The waveform of the resampled output signal 124 is shown at 212. The portion of the resampled output signal 124 corresponding to each non-zero portion of the divided signal 122 (waveform 208) is composed of a burst of pulses each similar to the pulses of input signal 106. The portion of the resampled output signal 124 corresponding to each zero portion of the divided signal 122 is a zero portion. The edge jitter of the resampled output signal 124 is comparable with that of input signal 106 and is substantially less than that of divided signal 122. Thus, if the input signal 106 has low edge jitter, the resampled output signal 124 also has low edge jitter.

Embodiments of the RNFDS 100 shown in FIG. 1 may be implemented in varying types of hardware. As an example, the RNFDS 100 may be implemented using discrete components for the resampler 112 and frequency divider 114. Alternatively, the RNFDS 100 may be integrated in one or more integrated circuits ("ICs") or may constitute part of a more complex IC.

Figure 3:
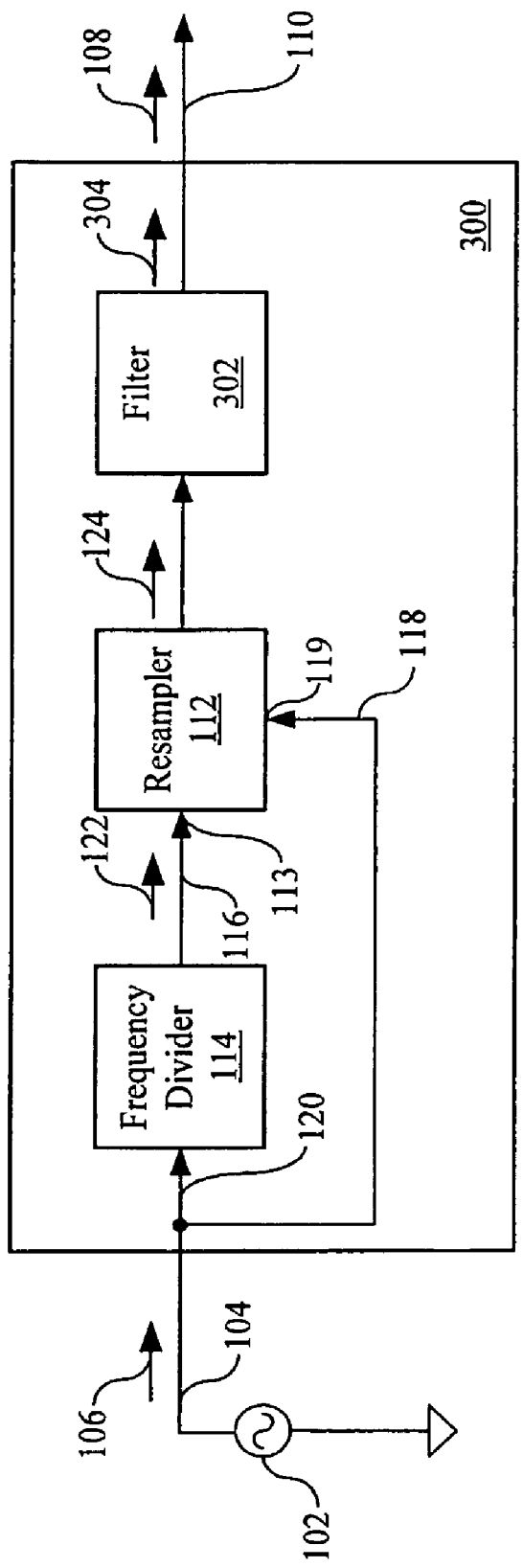
FIG. 3 is a block diagram showing an example of an RNFDS having a filter in accordance with another embodiment of the present invention.

Some circuits are capable of using the resampled output signal 124 generated by an embodiment of the RNFDS 100 as a low-noise clock signal notwithstanding the complex waveform of the resampled output signal 124. Other circuits require a low-noise clock signal with a simpler waveform, i.e., a low-noise clock signal with a waveform similar to the waveform 208 of the divided signal 122. FIG. 3 is a block diagram showing an example of an RNFDS 300 in accordance with another embodiment of the invention in which a filter 302 is interposed between the resampler 112 and the signal path 110. The filter 302 is a low-pass filter that converts the waveform of the portions of the resampled output signal 124 corresponding to the non-zero portions of the divided signal 122 to a non-return-to-zero waveform. This simplifies the waveform of the resampled output signal 124 and makes this waveform more similar to that of divided signal 122. In operation, the filter 302 receives the resampled output signal 124 and filters the resampled output signal 124 to produce a filtered resampled output signal 304. The RNFDS 300 outputs the filtered resampled output signal 304 as the reduced-noise output signal 108.

In other embodiments, a narrow band-pass filter (not shown) is used as the filter 302. In such embodiments, the filtered resampled output signal 304 has a sinusoidal waveform. The band-pass filter has a center frequency equal to the frequency of the resampled output signal 124.

Figure 4:
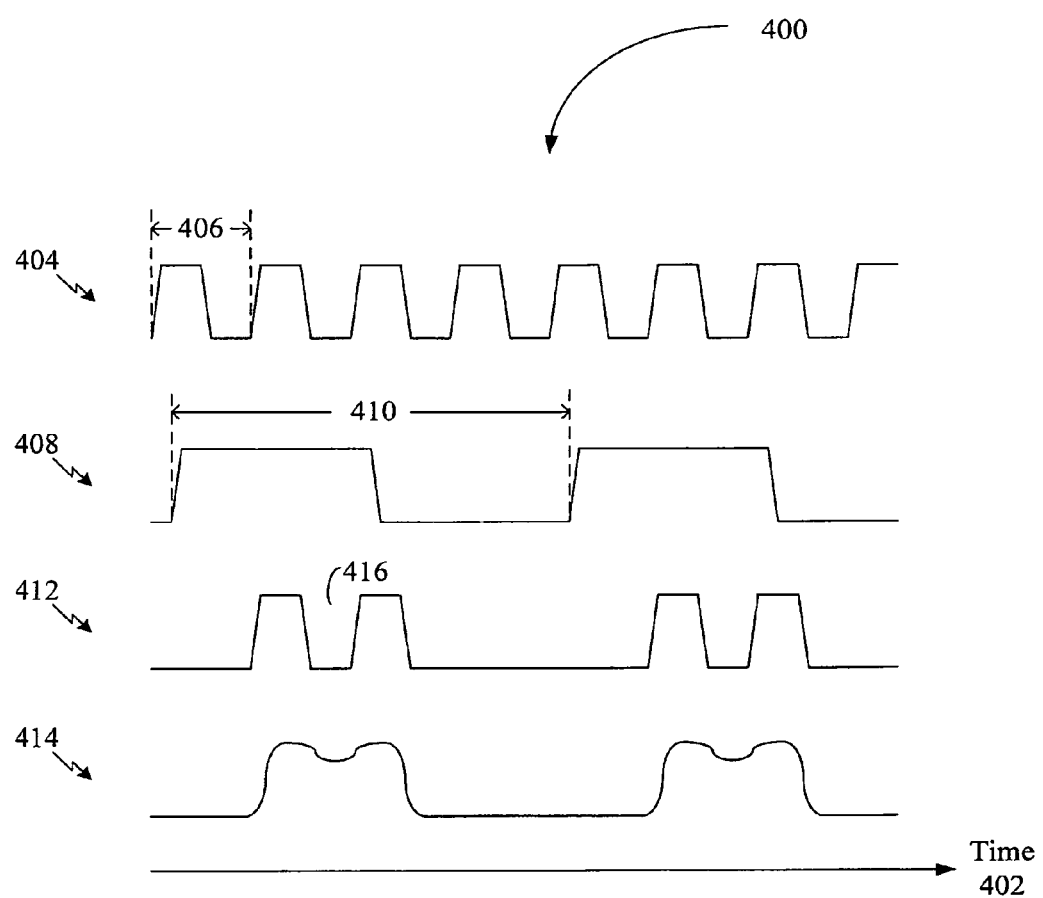
FIG. 4 is a timing diagram showing exemplary waveforms of signals in the RNFDS shown in FIG. 3.

FIG. 4 is a timing diagram 400 showing exemplary waveforms of signals in an example of the RNFDS 300 in which the frequency divider 114 is a divide-by-four frequency divider. The waveforms are voltages or currents plotted against time 402. In this example, similar to FIG. 2, the waveform of the input signal 106 is shown at 404 as a series of pulses. Each pulse has a first period 406. The waveform of the divided signal 122 produced by the divide-by-four frequency divider 114 is shown at 408 as a series of pulses. Each pulse has a second period 410. In this example, the second period 410 is four times as long as the first period 406. The waveform of the resampled output signal 124 is shown at 412 as a series of pulses. Each pulse has a period equal to the second period 410. The waveform of the filtered resampled output signal 304 that is output as reduced-noise output signal 108 is shown at 414 as a series of pulses. Each, pulse has a period equal to the second period 410. The waveform 414 of the portions of the filtered resampled output signal corresponding to the non-zero portions of the divided signal 122 is a non-return-to-zero waveform. This is the result of filter 302 filling in "gaps" 416 in the waveform 412. Again, the edge jitter of filtered resampled output signal 304 is comparable with that of the input signal 106 and is substantially less than that of the divided signal 122. Thus, if the input signal 106 has low edge jitter, the resampled output signal 124 also has low edge jitter.

Figure 5:
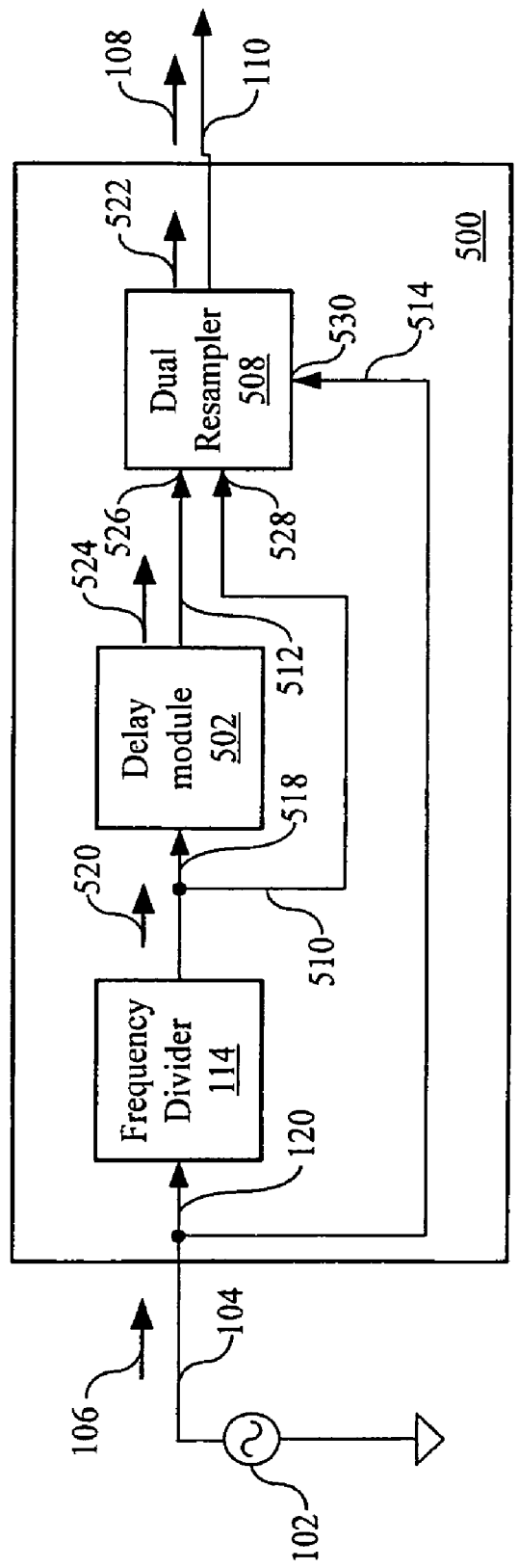
FIG. 5 is a block diagram showing an example of an RNFDS having a delay module and a dual resampler in accordance with another embodiment of the present invention.

FIG. 5 is a block diagram showing an example of an RNFDS 500 in accordance with another embodiment of the invention. The RNFDS 500 further simplifies the waveform of the reduced-noise output signal 108 by resampling the divided signal and a delayed version of the divided signal in response to respective components of a differential sampling clock signal to generate respective resampled signal components. The resampled signal components are summed to generate the resampled output signal.

Similar to the examples shown in FIGS. 1 and 3, the RNFDS 500 is connected to the external frequency source 102 via the signal path 104. In an example of operation, the RNFDS 500 receives the input signal 106 via the signal path 104 and, in response, produces the reduced-noise output signal 108 that is output via the signal path 110.

In the example shown, the RNFDS 500 includes the frequency divider 114, a delay module 502, and a dual resampler 508. The dual resampler 508 has a first signal input 526, a second signal input 528 and a clock input 530. The first signal input 526 is connected to the delay module 502 via a signal path 512. The second signal input 528 is connected to the frequency divider 114 via a signal path 510. The clock input 530 is connected to the external frequency source 102 via a signal path 514. In this embodiment, external frequency source 102 provides input signal 106 as a differential signal having an in-phase component and an antiphase component. The clock input 530 is a differential input that receives the in-phase and antiphase components of the input signal 106 as an in-phase sampling clock signal component and an antiphase sampling clock signal component, respectively. The frequency divider 114 is connected to the external frequency source 102 and delay module 502 via signal paths 120 and 518, respectively.

Similar to FIGS. 1 and 3, the dual resampler 508 is any device capable of resampling the divided signal 520 and a delayed divided signal 524 in response to the antiphase sampling clock signal component and the in-phase sampling clock signal component, respectively, to produce respective resampled signal components, and of summing the resampled signal components to produce a resampled output signal 522. In some embodiments, the dual resampler 508 includes a summing module (not shown) that sums the resampled signal components to produce the resampled output signal 522. In other embodiments, the dual resampler 508 has a summing node (not shown) at which the resampled signal components are summed to produce the resampled output signal 522.

The delay module 502 is a device capable of time-delaying the divided signal 520 to produce the delayed divided signal 524. The delayed divided signal 524 is input to the first input 526 of the dual resampler 508 in addition to the divided signal 520 that is input to the second input 528 of the dual resampler 508.

In an example of operation, the RNFDS 500 receives the input signal 106 and inputs the input signal 106 to both the frequency divider 114 and the clock input 530 of the dual resampler 508. The frequency divider 114 receives the input signal 106 and, in response, produces the divided signal 520. The divided signal 122 is noisy because of edge jitter imposed on its transitions by the frequency divider 114. The frequency of the divided signal 520 is equal to the frequency of the input signal 106 divided by the modulus N of the frequency divider 114. The divided signal 520 passes directly to the second signal input 528 of the dual resampler 508 and passes through the delay module 502 to the first signal input 526 of the dual resampler 508 as the delayed divided signal 524. The dual resampler 508 operates in response to the antiphase sampling clock signal component received at its clock input 530 to resample the divided signal 520 received from the frequency divider 114, and additionally operates in response to the in-phase sampling clock signal component received at its clock input 530 to resample the delayed divided signal 528 received from delay module 502. The dual resampler 508 samples the divided signal 520 and the delayed divided signal 524 at static portions of the respective signals. The resampling operations performed by the dual resampler 508 in response to the antiphase sampling clock signal component and the in-phase sampling clock signal component generate respective resampled signal components. The dual resampler 508 sums the resampled signal components to generate a resampled output signal 522. In this example, the RNFDS 500 outputs the resampled output signal 522 via the signal path 110 as the reduced-noise output signal 108.

Similar to FIGS. 1 and 3, the RNFDS 500 may be implemented in varying types of hardware. As an example, the RNFDS 500 may be implemented using discrete components for the frequency divider 114, the delay module 502 and the dual resampler 508. Alternatively, the RNFDS 500 may be integrated into one or more ICs or may constitute part of a more complex IC.

Figure 6:
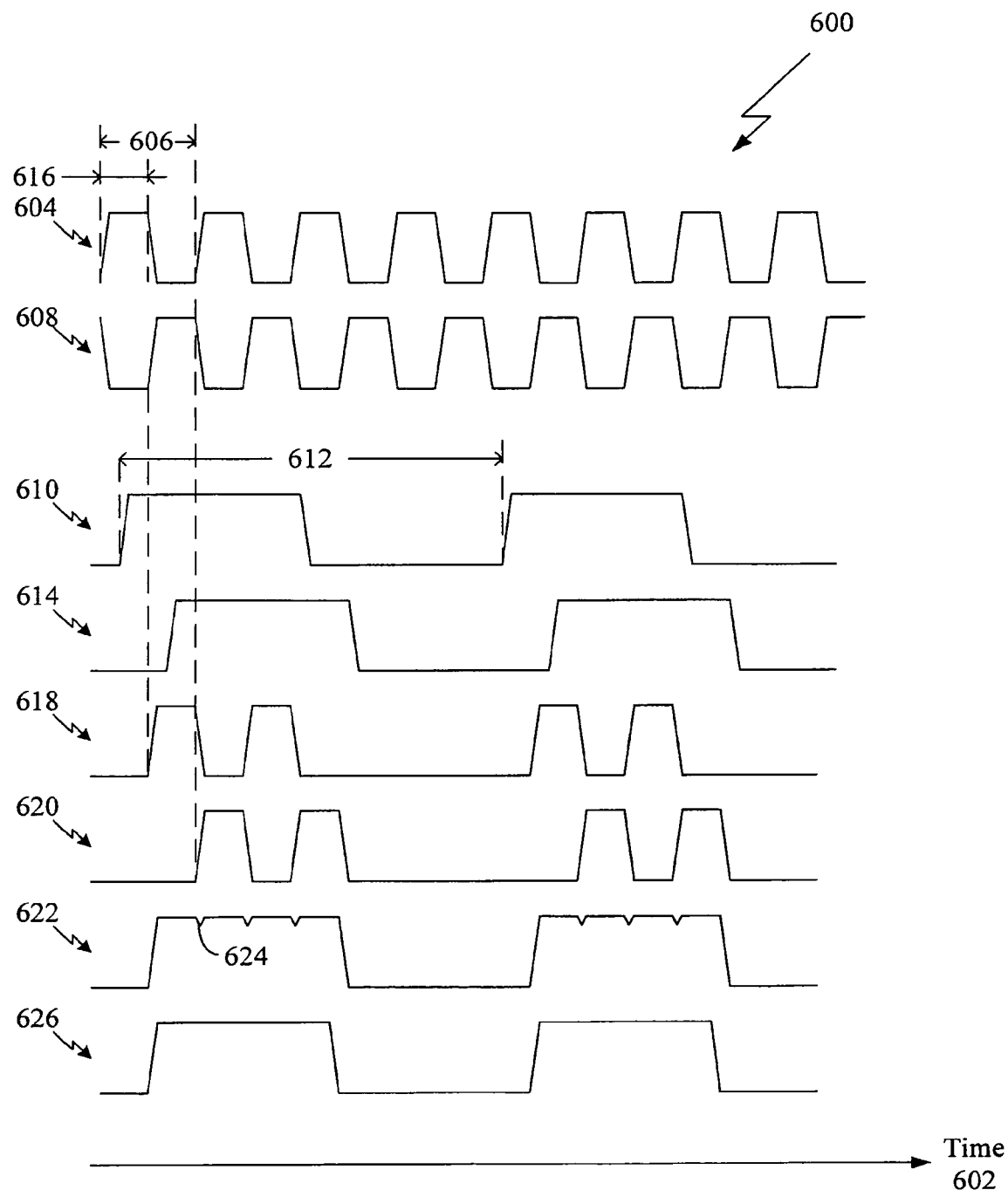
FIG. 6 is a timing diagram showing exemplary waveforms of signals in the RNFDS shown in FIG. 5.

FIG. 6 is a timing diagram 600 showing exemplary waveforms of signals in an example of the RNFDS 500 in which the frequency divider 114 is a divide-by-four frequency divider. The waveforms shown are voltages or currents plotted against time 602. In this example, similar to FIGS. 2 and 4, the waveform of the in-phase sampling clock signal component received at the clock input 530 of the dual resampler 508 is shown at 604 as a series of pulses. Each pulse has a first period 606. The waveform of the antiphase sampling clock signal component also received at the clock input 530 of the dual resampler 508 is shown at 608 as a series of pulses. Each pulse also has a period equal to the first period 606.

The waveform of the divided signal 520 produced by the divide-by-four frequency divider 114 is shown at 610 as a series of pulses. Each pulse has a second period 612. In this example, the second period 612 is four times as long as the first period 606. The waveform of the delayed divided signal 524 produced by the delay module 502 is shown at 614 as a series of pulses. Each pulse has a period equal to the second period 610. The waveform 614 is the same as waveform 610 but the waveform 614 is delayed relative to the waveform 610 by a time delay 616 imposed by the delay module 502. In this example, the time delay 616 is equal to one-half of the first period 606 of the sampling clock signal components provided by the input signal 106.

The waveform of a first resampled signal component generated by the dual resampler 508 from the divided signal 520 is shown at 618. The dual resampler 508 generates the first resampled signal component by resampling the divided signal 520 in response to the antiphase sampling clock signal component whose waveform is shown at 608. The portion of the first resampled signal component corresponding to the non-zero portion of the divided signal 520 (waveform 610) is composed of a burst of pulses each similar to the pulses of the antiphase sampling clock signal. The portion of the first resampled signal component corresponding to each zero portion of the divided signal 520 is a zero portion. The first resampled signal is the result of a logical AND operation between the antiphase sampling clock signal whose waveform is shown at 608 and the divided signal 520 whose waveform is shown at 610.

The waveform of a second resampled signal generated by the dual resampler 508 from the delayed divided signal 524 is shown at 620. The dual resampler 508 generates the second resampled signal component by resampling the delayed divided signal 524 in response to the in-phase sampling clock signal component whose waveform is shown at 604. The second resampled signal component is delayed relative to the first delayed signal component by a delay equal to the time delay 626. The portion of the second resampled signal component corresponding to the non-zero portion of the delayed divided signal 524 is composed of a burst of pulses each similar to the pulses of the in-phase sampling clock signal. The portion of the second resampled signal component corresponding to each zero portion of delayed divided signal 524 is a zero portion. The second resampled signal component is the result of a logical AND operation between the in-phase sampling clock signal whose waveform is shown at 604 and the delayed divided signal 524 whose waveform is shown at 614.

The dual resampler 508 sums the first resampled signal component, whose waveform is shown at 618, and the second resampled signal component, whose waveform is shown at 620, to generate the resampled output signal 522. In this example, the waveform of the resampled output signal 522 is shown at 622 as a series of pulses. Each pulse has a period equal to the second period 612. The edge jitter of the resampled output signal 522 is comparable with that of the input signal 106 and is substantially less than that of the divided signal 520. Thus, if the input signal 106 has low edge jitter, the resampled output signal 522 also has low edge jitter.

Figure 7:
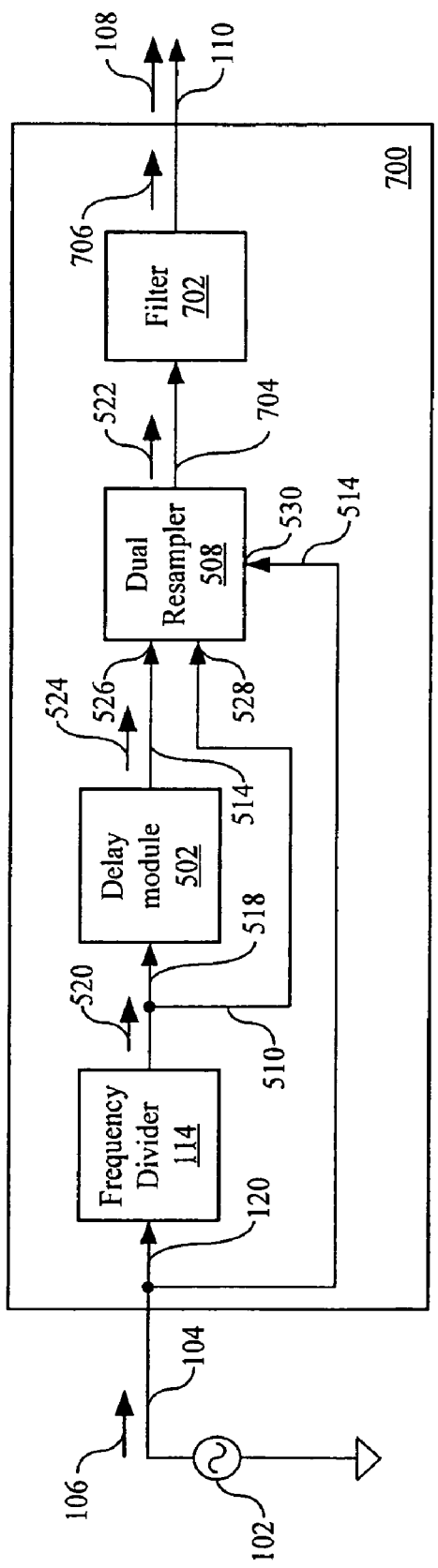
FIG. 7 is a block diagram showing an example of an RNFDS having a dual resampler, a delay module, and a filter in accordance with another embodiment of the present invention.

The non-zero portions of the resampled output signal 522 generated by RNFDS 500 have glitches at the transitions between the in-phase resampled signal component and the antiphase resampled signal component. An exemplary glitch is shown at 624 in the waveform 622 shown in FIG. 6. FIG. 7 is a block diagram showing an example of an RNFDS 700 in accordance with another embodiment of the invention in which a filter 702 is interposed between the dual resampler 508 and the signal path 110. The filter 702 is a low-pass filter that filters the resampled output signal 522 to remove the glitches. Otherwise, the RNFDS 700 has the same structure as the RNFDS 500 described above with reference to FIG. 5. In operation, the filter 702 receives the resampled output signal 522 from the dual resampler 508 and filters the resampled output signal 522 to produce a filtered resampled output signal 706. The RNFDS 700 outputs the filtered resampled output signal 706 via the signal path 110 as the reduced-noise output signal 108.

In other embodiments, a narrow band-pass filter (not shown) is used as the filter 702. In such embodiments, the filtered resampled output signal 706 has a sinusoidal waveform. The band-pass filter has a center frequency equal to the frequency of the resampled output signal 522.

FIG. 6 shows an example of the waveform of the filtered resampled output signal 706 at 626 as a series of pulses. Each pulse has a period equal to the second period 612. The waveform 626 is free of the glitches 624 exhibited by the waveform 622 of the resampled output signal 522.

In the examples of the RNFDS 500 described above with reference to FIG. 5 and the RNFDS 700 described above with reference to FIG. 7, the external frequency source 102 is described as providing the input signal 106 as a differential signal having an in-phase component and an antiphase component. The differential input signal provides a differential sampling clock signal to the dual resampler 508.

Figure 8:
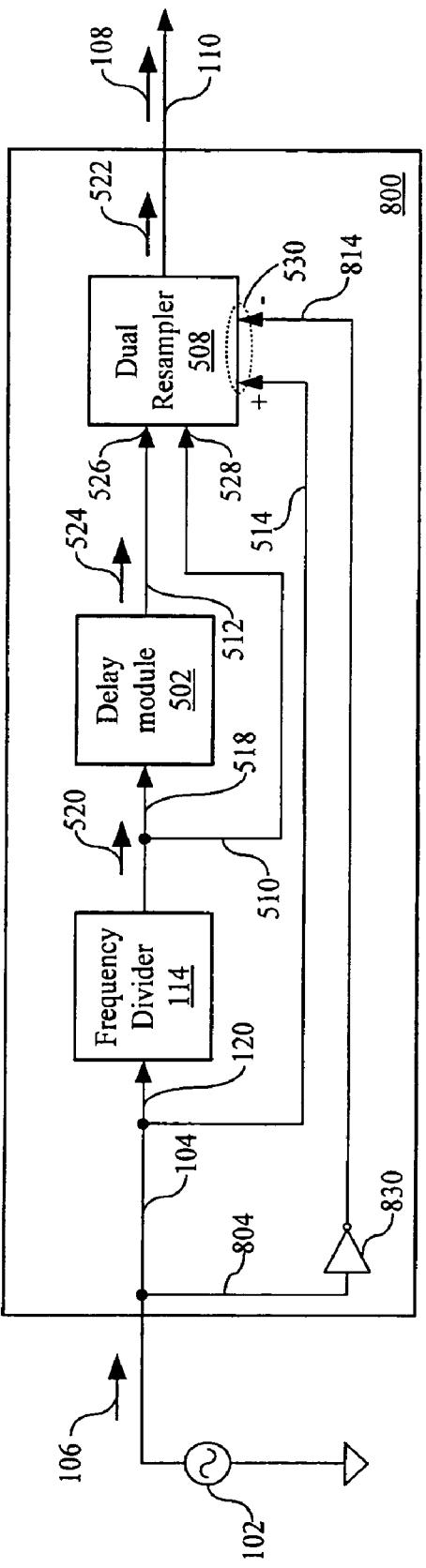
FIG. 8 is a block diagram showing an inverter for generating a differential input signal from a single-ended input signal.

FIG. 8 is a block diagram showing an example of an RNFDS 800 in accordance with an embodiment of the invention. In the RNFDS 800, the external frequency source 102 provides the input signal 106 as a single-ended input signal having only an in-phase component and the dual resampler 508 uses a differential sampling clock signal. The clock input 530 of the dual resampler 508 has an in-phase terminal (+) and an antiphase terminal (−). The in-phase terminal (+) of the clock input 530 is connected to the external frequency source 102 via the signal path 514, as described above with reference to FIG. 5. The RNFDS 800 includes an inverter 830 whose input is connected to the external frequency source 102 via a signal path 804. The output of the inverter 830 is connected to the antiphase terminal (−) of the clock input 530 of the dual resampler 508 via a signal path 814. Otherwise, the RNFDS 800 has the same structure as the RNFDS 500 described above with reference to FIG. 5. Optionally, the RNFDS 800 additionally includes a filter connected to receive the resampled output signal 522 as described above with reference to FIG. 7.

In operation of the RNFDS 800, the external frequency source 102 provides the input signal 106 to the frequency divider 114, to the in-phase terminal (+) of the clock input 530 of the dual resampler 508 and to the input of the inverter 830. The input signal 106 provided to the in-phase terminal of the clock input 530 is the in-phase component of the sampling clock signal. The frequency divider 114 and the dual resampler 508 operate as described above in response to the input signal 106 and the in-phase component of the sampling clock signal, respectively. The inverter 830 inverts the input signal 106 and provides the resulting antiphase component of the sampling clock signal to the antiphase terminal (−) of the clock input 530 of the dual resampler 508. The dual resampler 508 operates as described above in response to the antiphase component of the sampling clock signal. The waveform of the antiphase clock signal is shown at 608 in FIG. 6. Otherwise, operation of the RNFDS 800 is the same as that of the RNFDS 500 described above with reference to FIG. 5.

In an embodiment of the RNFDS 800 in which the frequency divider 114 has a differential input having an in-phase terminal (not shown) and an antiphase terminal (not shown), the external frequency source 102 is connected to the in-phase terminal of the frequency divider 114 and the output of the inverter 830 is connected to the antiphase terminal of the frequency divider 114 in addition to the antiphase terminal of the clock input 530 of the dual resampler 508.

Figure 9:
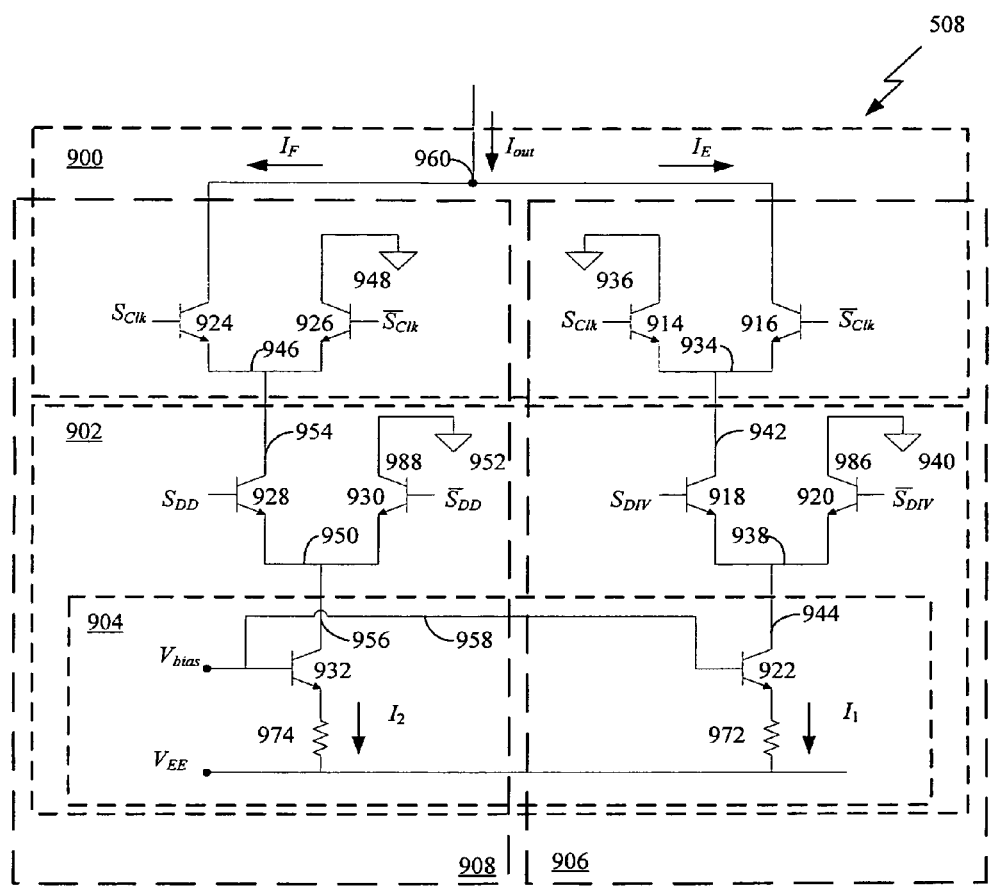
FIG. 9 is a circuit diagram showing an example of a dual resampler that may be used in embodiments of the RNFDS in accordance with the present invention.

FIG. 9 is a circuit diagram showing an example of the dual resampler 508. In the example shown, each of the divided signal 520, the delayed divided signal 524 and the input signal 106 is a differential signal having a respective in-phase signal component and a respective antiphase signal component, and the resampled output signal 522 is a single-ended signal. The example of the dual resampler 508 shown includes a resampling switch 900 and an analog output circuit 902. The analog output circuit 902 includes a current source circuit 904.

The dual resampler 508 is composed of a first resampler 906 and a second resampler 908. The first resampler 906 may be used as the resampler 112 in the RNFDS 100 and the RNFDS 300 described above with reference to FIGS. 1 and 3, respectively. The first resampler 906 draws a current $I_E$ having a return-to-zero waveform. The current $I_E$ is the first resampled signal component that represents the divided signal 520 logically ANDed with the antiphase sampling clock signal component provided by the antiphase component of input signal 106. The second resampler 908 draws a current $I_F$ having a return-to-zero waveform. The current $I_F$ is the second resampled signal component that represents the delayed divided signal 524 logically ANDed with the in-phase sampling clock signal component provided by the in-phase component of input signal 106.

In the example shown, the first resampler 906 includes transistors 914, 916, 918, 920, and 922. Transistors 914 and 916 are connected as a differential pair by a signal path 934, and the collector of the transistor 914 is connected to ground 936. Similarly, transistors 918 and 920 are connected as a differential pair by a signal path 938, and the collector of the transistor 920 is connected to ground 940. The collector of transistor 918 is connected to the emitters of transistors 914 and 916 via a signal path 942. The collector of transistor 922 is connected to the emitter of transistors 918 and 920 via a signal path 944.

Similarly, the second resampler 908 includes transistors 924, 926, 928, 930, and 932. Transistors 924 and 926 are connected as a differential pair by a signal path 946 and the collector of transistor 926 is connected to ground 948. Similarly, transistors 928 and 930 are connected as a differential pair by a signal path 950, and the collector of transistor 930 is connected to ground 952. The collector of transistor 928 is connected to the emitters of transistors 924 and 926 via a signal path 954. The collector of transistor 932 is connected to the emitters of transistors 928 and 930 via a signal path 956. Additionally, the base of transistor 932 is connected to the base of transistor 922 via a signal path 958.

Transistors 914, 916, 918, 920, 922, 924, 926, 928, 930, and 932 may be transistors of any type, such as bipolar transistors, field-effect transistors ("FETs"), metal oxide semiconductor ("MOS") transistors or other types of transistors. Alternatively, these transistors may be a mixture of transistors of different types.

In the example shown, transistors 914, 916, 918, 920, 922, 924, 926, 928, 930, and 932 are bipolar transistors, and the analog output element 902 and the resampling switch 900 are configured to draw currents $I_E$ and $I_F$ in response to divided signal components $S_{Div}$ and $\overline{S}_{Div}$, delayed divided signal components $S_{DD}$ and $\overline{S}_{DD}$, and sampling clock signal components $S_{Clk}$ and $\overline{S}_{Clk}$. Divided signal components $S_{Div}$ and $\overline{S}_{Div}$ are the in-phase and antiphase components, respectively, of the divided signal 520. Delayed divided signal components $S_{DD}$ and $\overline{S}_{DD}$ are the in-phase and antiphase components, respectively, of the delayed divided signal 524. Sampling clock signal components $S_{Clk}$ and $\overline{S}_{Clk}$ are the in-phase and antiphase components of the sampling clock signal provided by the input signal 106.

The analog output element 902 includes differentially-connected transistors 918 and 920, differentially-connected transistors 928 and 930, and a current source circuit 904 comprising transistors 922 and 932. The emitters of the differentially-connected transistors 918 and 920 and differentially-connected transistors 928 and 930 are connected to the collectors of current source transistors 922 and 932 via signal paths 944 and 956, respectively. The base of the differentially-connected transistor 918 receives in-phase divided signal component $S_{Div}$, while the base of the differentially-connected transistor 920 receives antiphase divided signal component $\overline{S}_{Div}$. Similarly, the base of the differentially-connected transistor 928 receives in-phase delayed divided signal component $S_{DD}$, while the base of the differentially-connected transistor 930 receives antiphase delayed divided signal component $\overline{S}_{DD}$.

The current source circuit 904 includes transistors 922 and 932 and resistors 972 and 974, which are connected between the emitters of transistors 922 and 932 and a negative voltage supply $V_{EE}$, e.g., −3.3V. The bases of the transistors 922 and 932 are connected to receive a bias voltage $V_{bias}$. The transistors 922 and 932 and the resistors 972 and 974 of the current source circuit 904 operate to conduct fixed currents $I_1$ and $I_2$ that define the values of currents $I_E$ and $I_F$, respectively. Currents $I_E$ and $I_F$ are summed at a summing node 960 to form an output current $I_{out}$, which provides the resampled output signal 522. The value of the output current $I_{out}$ is set by the voltage difference between bias voltage $V_{bias}$ and negative supply voltage $V_{EE}$, which sets the values of the currents $I_1$ and $I_2$.

The collectors of transistors 918 and 928 that constitute part of the analog output element 902 are connected to the emitters of transistors 914 and 916 and 924 and 926, respectively, via signal paths 942 and 954, respectively. The collector of transistor 916 receives the current $I_E$ and the collector of transistor 924 receives the current $I_F$. The in-phase sampling clock signal component $S_{Clk}$ is applied to the bases of the transistors 914 and 924 and the antiphase sampling clock signal component $\overline{S}_{Clk}$ is applied to the bases of the transistors 916 and 926. The collectors of the transistors 914 and 926 are connected to ground connections 936 and 948, respectively, to provide current to the transistor 914 when the in-phase clock signal component $S_{Clk}$ is greater than antiphase sampling clock signal component $\overline{S}_{Clk}$ and to provide current to the transistor 926 when the in-phase clock signal component $S_{Clk}$ is less than antiphase sampling clock signal component $\overline{S}_{Clk}$.

In an alternative implementation that generates the resampled output signal 522 as a differential signal, the collectors of transistors 920 and 930 are each connected to the emitters of a respective additional differential pair of transistors. The additional differential pairs of transistors are similar to the differential pairs of transistors 924, 926, and 914, 916. Like the differential pairs of transistors 924, 926, and 914, 916, the additional differential pairs of transistors are controlled by sampling clock signal components $S_{Clk}$ and $\overline{S}_{Clk}$. The additional differential pairs of transistors produce an output current component $\overline{I}_{out}$ in antiphase with the in-phase output current component $I_{out}$.

Figure 10:
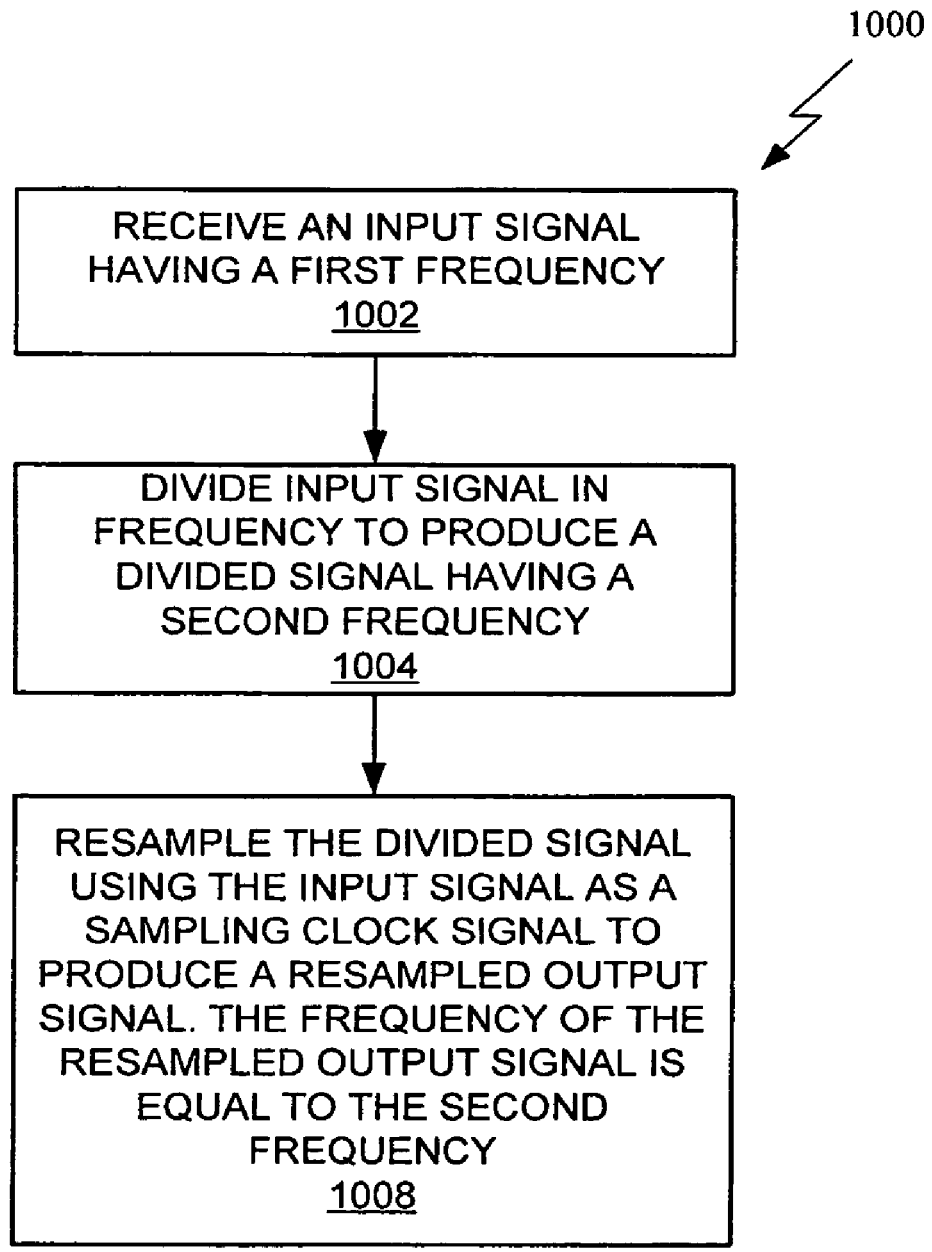
FIG. 10 is a flow diagram showing an example of a reduced noise frequency dividing method accordance with an embodiment of the present invention.

FIG. 10 is a flow diagram 1000 showing an example of a reduced-noise frequency dividing method in accordance with an embodiment of the invention. In block 1002, an input signal having a first frequency is received. In block 1004, the input signal is divided in frequency to produce a divided signal having a second frequency. In block 1008, the divided signal is resampled using the input signal as a sampling clock signal to produce a resampled output signal. The frequency of the resampled output signal is equal to the second frequency. In an embodiment, the resampled output signal is filtered to produce a filtered to produce a filtered resampled output signal, as described above. Dividing the input signal in frequency imposes jitter on the transitions of the divided signal. Resampling the divided signal reduces the edge jitter of the resampled output signal to a level comparable with that of the input signal. Thus, if the input signal has low edge jitter, the resampled output signal also has low edge jitter and can be regarded as a low-noise signal.

Figure 11:
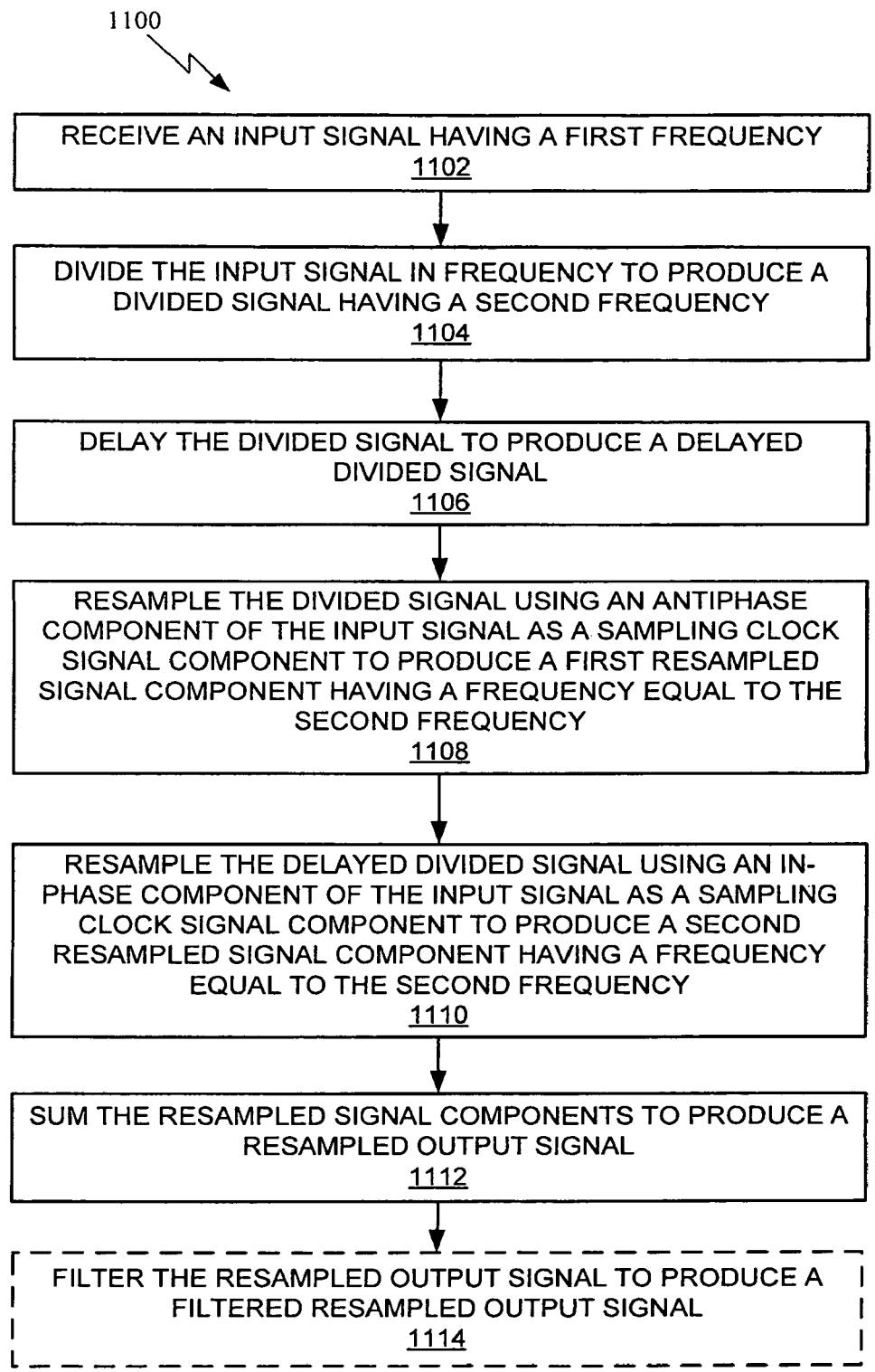
FIG. 11 is a flow diagram showing an example of a reduced-noise frequency dividing method in accordance with another embodiment of the present invention.

FIG. 11 is a flow diagram 1100 showing an example of a reduced-noise frequency dividing method in accordance with another embodiment of the invention. In block 1102, an input signal having a first frequency is received. In block 1104, the input signal is divided in frequency to produce a divided signal having a second frequency. In block 1106, the divided signal is delayed to produce a delayed divided signal. In block 1108, the divided signal is resampled using an antiphase component of the input signal as a sampling clock signal component to produce a first resampled signal component. The frequency of the first resampled signal component is equal to the second frequency. In block 1110, the delayed divided signal is resampled using an in-phase component of the input signal as a sampling clock signal component to produce a second resampled signal component. The frequency of the second resampled signal component is equal to the second frequency. In block 1112, the resampled signal components are summed to produce a resampled output signal. In block 1114, which is optional, the resampled output signal is filtered to produce a filtered resampled output signal. The edge jitter of the resampled output signal and, if present, the filtered resampled output signal is comparable with that of in the input signal.

The foregoing description of various embodiments has been presented for purposes of illustration and description. It is not exhaustive and does not limit the claimed inventions to the precise form disclosed. Modifications and variations are possible in light of the above description or may be acquired from practicing the invention. It should be noted also that the implementation might also vary between systems. The claims and their equivalents define the scope of the invention.

I claim:

1. A reduced-noise frequency divider system ("RNFDS"), comprising:
    a frequency divider configured to receive an input signal and, in response, to produce a divided signal; and
    a resampler connected to receive the input signal and the divided signal, and operable in response to the input signal to resample the divided signal to produce a resampled output signal; wherein:
    the RNFDS additionally comprises a delay module connected to receive the divided signal and operable to produce a delayed divided signal; and
    the resampler comprises:
        a first resampler connected to receive the divided signal and an antiphase component of the input signal and operable in response to the antiphase component of the input signal to resample the divided signal to produce a first resampled signal component,
        a second resampler connected to receive the delayed divided signal and an in-phase component of the input signal and operable in response to the in-phase component of the input signal to resample the delayed divided signal to produce a second resampled signal component, and
        a summing node at which the resampled signal components are summed to produce the resampled output signal.

2. The RNFDS of claim 1, additionally comprising a filter connected to receive the resampled output signal and operable to filter the resampled output signal to produce a filtered resampled output signal.

3. The RNFDS of claim 1, additionally comprising a filter connected to receive the resampled output signal and operable to filter the resampled output signal to produce a filtered resampled output signal.

4. The RNFDS of claim 3, in which the filter is a low-pass filter.

5. The RNFDS of claim 1, additionally comprising an inverter connected to receive the input signal and operable to invert the input signal to produce the antiphase component of the input signal.

6. The RNFDS of claim 1, in which the input signal is a differential signal.

7. The RNFDS of claim 1, in which the frequency divider is a divide-by-N frequency divider, where N is the modulus of the frequency divider.

8. A reduced-noise frequency dividing method, comprising:
    receiving an input signal;
    dividing the input signal in frequency to produce a divided signal; and
    resampling the divided signal using the input signal as a sampling clock signal to produce a resampled output signal; wherein:
    the method additionally comprises delaying the divided signal to produce a delayed divided signal, and
    the resampling comprises:
        resampling the divided signal using an antiphase component of the input signal as a sampling clock signal component to produce a first resampled signal component,
        resampling the delayed divided signal using an in-phase component of the input signal as a sampling clock signal component to produce a second resampled signal component, and
        summing the resampled signal components to produce the resampled output signal.

9. The method of claim 8, additionally comprising filtering the resampled output signal to produce a filtered resampled output signal.

10. The method of claim 8, additionally comprising filtering the resampled output signal to produce a filtered resampled output signal.

11. The method of claim 10, in which the filtering comprises low-pass filtering.

12. The method of claim 8, in which the receiving comprises inverting the input signal to produce the antiphase component of the input signal.

13. A reduced-noise frequency divider system ("RNFDS"), comprising:
    means for dividing an input signal in frequency to produce a divided signal; and
    means for resampling the divided signal in response to the input signal to produce a resampled output signal; wherein
    the RNFDS additionally comprises means for delaying the divided signal to produce a delayed divided signal; and
    the means for resampling comprises:
    means for resampling the divided signal using an antiphase component of the input signal as a sampling clock signal component to produce a first resampled signal component,
    means for resampling the delayed divided signal using an in-phase component of the input signal as a sampling clock signal component to produce a second resampled signal component, and
    means for summing the resampled signal components to produce the resampled output signal.

14. The RNFDS of claim 13, additionally comprising means for filtering the resampled output signal to produce a filtered output signal.

15. The RNFDS of claim 13, additionally comprising means for filtering the resampled output signal to produce a filtered resampled output signal.

16. The RNFDS of claim 13, additionally comprising means for inverting the input signal to produce the antiphase component of the input signal.

17. The RNFDS of claim 13, in which the means for frequency dividing comprises a divide-by-N frequency divider, where N is the modulus of the frequency divider.

* * * * *

UNITED STATES PATENT AND TRADEMARK OFFICE
CERTIFICATE OF CORRECTION

PATENT NO. : 7,532,049 B2 Page 1 of 1
APPLICATION NO. : 11/588502
DATED : May 12, 2009
INVENTOR(S) : Robert E. Jewett It is certified that error appears in the above-identified patent and that said Letters Patent is hereby corrected as shown below:

On the Title page, in field (75), in "Inventor", in column 1, line 1, delete "Redwood City," and insert -- Santa Clara, --, therefor.

In column 12, line 39, in Claim 13, after "wherein" insert -- : --.

Signed and Sealed this

Fourteenth Day of July, 2009

JOHN DOLL
*Acting Director of the United States Patent and Trademark Office*